(12) United States Patent
Choi et al.

(10) Patent No.: US 8,894,406 B2
(45) Date of Patent: Nov. 25, 2014

(54) PATTERNING MOLD AND MANUFACTURING METHOD THEREOF

(75) Inventors: Eui Sun Choi, Seoul (KR); Eun Soo Hwang, Seoul (KR); Young Tae Cho, Suwon-si (KR); Dong Min Kim, Suwon-si (KR); Jeong Gil Kim, Suwon-si (KR); Jong Woo Lee, Suwon-si (KR); Eun Ah Park, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 373 days.

(21) Appl. No.: 13/229,047

(22) Filed: Sep. 9, 2011

(65) Prior Publication Data

US 2012/0082745 A1    Apr. 5, 2012

(30) Foreign Application Priority Data

Oct. 4, 2010  (KR) .................. 10-2010-0096339

(51) Int. Cl.
  *B29C 59/02*  (2006.01)
  *B29C 33/00*  (2006.01)
  *G03F 7/00*  (2006.01)
  *B29C 33/38*  (2006.01)
  *B29C 33/42*  (2006.01)

(52) U.S. Cl.
  CPC ......... *B29C 33/3857* (2013.01); *B29C 33/0016* (2013.01); *B29C 2033/426* (2013.01); *G03F 7/0002* (2013.01); *B29C 33/428* (2013.01); *G03F 7/0017* (2013.01)
  USPC .......... 425/385; 264/308; 264/494; 264/496; 264/293; 425/174.4

(58) Field of Classification Search
  USPC ........ 264/308, 494, 496, 293; 425/385, 174.4
  See application file for complete search history.

(56) References Cited

U.S. PATENT DOCUMENTS

| | | | |
|---|---|---|---|
| 5,897,937 A * | 4/1999 | Cornils et al. ................. 156/242 |
| 7,520,742 B2 * | 4/2009 | Motowaki et al. ............. 425/385 |
| 2005/0064054 A1 * | 3/2005 | Kasumi ......................... 425/112 |
| 2005/0133954 A1 * | 6/2005 | Homola ......................... 264/219 |
| 2005/0275251 A1 * | 12/2005 | Choi et al. ...................... 297/40 |
| 2006/0208392 A1 * | 9/2006 | Leach ............................ 264/220 |
| 2006/0290025 A1 * | 12/2006 | Chae et al. ..................... 264/219 |
| 2010/0148397 A1 * | 6/2010 | Nakamura et al. ............. 264/293 |

FOREIGN PATENT DOCUMENTS

JP   2003086537 A  *  3/2003  ............. H01L 21/30
KR   100568581       3/2006

* cited by examiner

*Primary Examiner* — Amjad Abraham
(74) *Attorney, Agent, or Firm* — Harness, Dickey & Pierce, P.L.C.

(57) ABSTRACT

Disclosed herein is a patterning mold configured to form a micropattern on a substrate or glass. The disclosed patterning mold includes a transfer body with a patterning part formed at one end of the transfer body to transfer a nanoparticle material to one surface of the substrate. The patterning mold further includes a fixing member coupled to an exterior of the transfer body, to prevent or reduce deformation of the exterior of the transfer body.

10 Claims, 21 Drawing Sheets

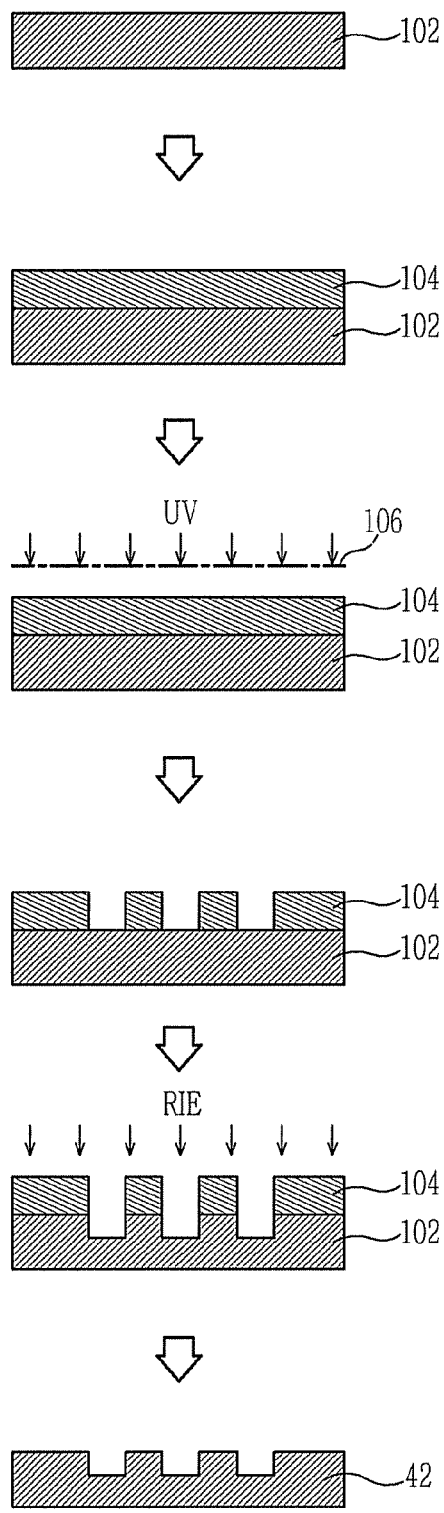

PATTERNING MOLD AND MANUFACTURING METHOD THEREOF

CROSS-REFERENCE TO RELATED APPLICATION

This application claims priority under 35 U.S.C. §119 to Korean Patent Application No. 2010-96339 filed on Oct. 4, 2010 in the Korean Intellectual Property Office (KIPO), the entire contents of which are incorporated herein by reference.

BACKGROUND

1. Field

Example embodiments relate to a patterning mold for forming a micropattern on a substrate, and a manufacturing method thereof.

2. Description of the Related Art

Recently, a patterning process, which uses printing, has been a focus of attention as a process for forming a micropattern on a substrate. This is because the patterning process, which uses printing, requires fewer pre-processing or post-processing steps and exhibits a rapid process rate, as compared to other conventional patterning processes, for example, a patterning process employing photolithography.

Examples of such printing-based patterning processes include a gravure or gravure offset process, a reverse offset process, a flexography process, and a micro-contact process, which use a blanket or mold to transfer a micropattern to a substrate. For a material of such a mold, a material exhibiting low surface energy, such as poly dimethyl siloxane (PDMS), as compared to the substrate, is generally used, taking into consideration bonding force to the substrate. However, such a mold material may be unsuitable for a mold to manufacture a substrate requiring high precision because the material exhibits low mechanical strength and is readily deformed.

SUMMARY

Example embodiments provide a patterning mold capable of forming a micropattern on a substrate or glass, and a manufacturing method thereof Example embodiments also provide a patterning mold having a structure capable of reinforcing mechanical rigidity, and a manufacturing method thereof.

Example embodiments also provide a patterning mold with a simple structure capable of forming a micropattern on a substrate or glass, and a manufacturing method thereof.

Example embodiments will be set forth in part in the description which follows and, in part, will be obvious from the description, or may be learned by practice of the invention.

In accordance with example embodiments, a patterning mold may include a transfer body and a fixing member. In example embodiments, the transfer body may include a patterning part at one end of the transfer body and the patterning part may be configured to transfer a nanoparticle material to a surface of a substrate. In example embodiments, the fixing member may be coupled to an exterior of the transfer body and the fixing member may be configured to reduce a deformation of the exterior of the transfer body.

In accordance with example embodiments, a patterning mold molding apparatus usable to form a micropattern on a substrate may include a first mold and a second mold. In example embodiments, the first mold may include an injection port through which a transfer body material is injected. In example embodiments the second mold may be configured to couple to the first mold. In example embodiments, the first mold and the second mold may be configured to form a cavity into which the transfer body material is injected.

In accordance with example embodiments, a method for manufacturing a patterning mold usable to form a micropattern on a substrate may include: providing a first mold, the first mold having an injection port configured to allow injection of a transfer body material; providing a second mold; coupling the first and second molds together to form a cavity; injecting the transfer body material into the cavity through the injection port to form a transfer body; and separating the second mold from the transfer body and the first mold coupled with the transfer body.

In accordance example embodiments, a patterning mold usable to form a micropattern on a substrate may include a transfer body, a patterning part formed at one end of the transfer body, to transfer a nanoparticle material to one surface of the substrate, and a fixing member coupled to an exterior of the transfer body, to prevent or reduce the exterior of the transfer body from being deformed.

The patterning part may include convex portions to be coupled with the nanoparticle material, and concave portions each arranged between adjacent ones of the convex portions.

The transfer body may include a fixing part. The fixing member may include a transfer body fixing portion. The fixing part may be coupled with the transfer body fixing portion.

The transfer body may further include a hinge part to prevent the patterning part from being deformed when the patterning part comes into contact with the surface of the substrate. The hinge part may be formed between the fixing part and the patterning part.

The hinge part may have a larger cross-sectional area than the patterning part.

The fixing member may include a step. The step may be coupled with patterning equipment to feed the patterning mold.

The transfer body fixing portion may be provided with irregularities to enhance a coupling force to the transfer body.

The irregularities may have a thread shape.

The transfer body fixing portion may be provided with a reinforcing member. The reinforcing member may be coupled with the transfer body, to prevent or reduce deformation of the transfer body due to gravity.

In accordance with example embodiments, a patterning mold molding apparatus usable to form a micropattern on a substrate may include a first mold, a second mold coupled to the first mold, to form a cavity, into which a transfer body material, and an injection port, through which the transfer body material is injected into the cavity.

The transfer body material may be cured in the cavity formed by the first and second molds, to form a transfer body. The transfer body may be separated from the second mold in a state of being coupled with the first mold, to form a patterning mold, together with the first mold.

The injection port may be provided at an upper portion of the first mold.

The first mold may include irregularities to enhance a coupling force to the transfer body.

The second mold may include a master pattern to form a patterning part to one end of the transfer body.

The patterning part may include convex portions to be coupled with the transfer body material, and concave portions each arranged between adjacent ones of the convex portions.

The second mold may include an inclined portion to allow the transfer body to be easily separated from the second mold.

The transfer body may include a fixing part. The fixing member may include a transfer body fixing portion. The fixing part may be coupled with the transfer body fixing portion.

The transfer body may further include a patterning part, and a hinge part to prevent the patterning part from being deformed when the patterning part comes into contact with one surface of the substrate. The hinge part may be formed between the fixing part and the patterning part.

The hinge part may have a smaller cross-sectional area than the patterning part.

The patterning mold molding apparatus may further include a third mold to form the hinge part. The third mold may be arranged between the first and second molds.

The first mold may be provided with a reinforcing member at an inner peripheral surface of the first mold. The reinforcing member may be fixed to the transfer body during curing of the transfer body material.

In accordance with example embodiments, a method for manufacturing a patterning mold usable to form a micropattern on a substrate includes arranging a first mold formed with an injection port to allow injection of a transfer body material, arranging a second mold to form a cavity, into which the transfer body material is to be injected, in a state of being coupled with the first mold, coupling the first and second molds, injecting the transfer body material into the cavity through the injection port, to form a transfer body, and separating the second mold from the transfer body and the first mold coupled with the transfer body.

The first mold may include irregularities.

The first mold may be provided with a reinforcing member at an inner peripheral surface of the first mold. The reinforcing member may be fixed to the transfer body during curing of the transfer body material.

The second mold may include a master pattern to form a patterning part at one end of the transfer body.

The second mold may include an inclined portion to allow the transfer body to be easily separated from the second mold.

The transfer body material may be a thermosetting resin or a photocurable resin.

BRIEF DESCRIPTION OF THE DRAWINGS

These and/or other aspects of the invention will become apparent and more readily appreciated from the following description of example embodiments, taken in conjunction with the accompanying drawings of which:

FIG. 5 is a view illustrating a process for manufacturing a master pattern to be used in the manufacture of a patterning mold according to example embodiments;

DETAILED DESCRIPTION

Figure 1:
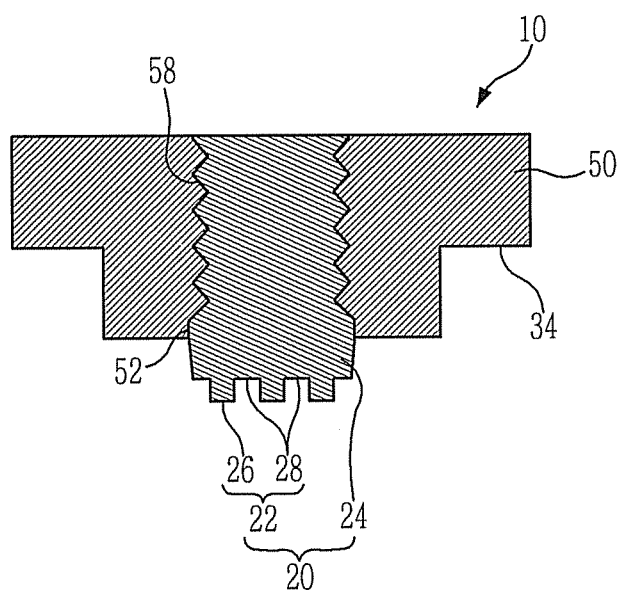
FIG. 1 is a sectional view illustrating a patterning mold according to example embodiments.

Example embodiments will be described more fully hereinafter with reference to the accompanying drawings, in which example embodiments are shown. The present invention may, however, be embodied in many different forms and should not be construed as limited to example embodiments as set forth herein. Rather, example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers that may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings. Throughout the specification, the same reference numerals designate the same constituent elements, respectively.

Figure 2:
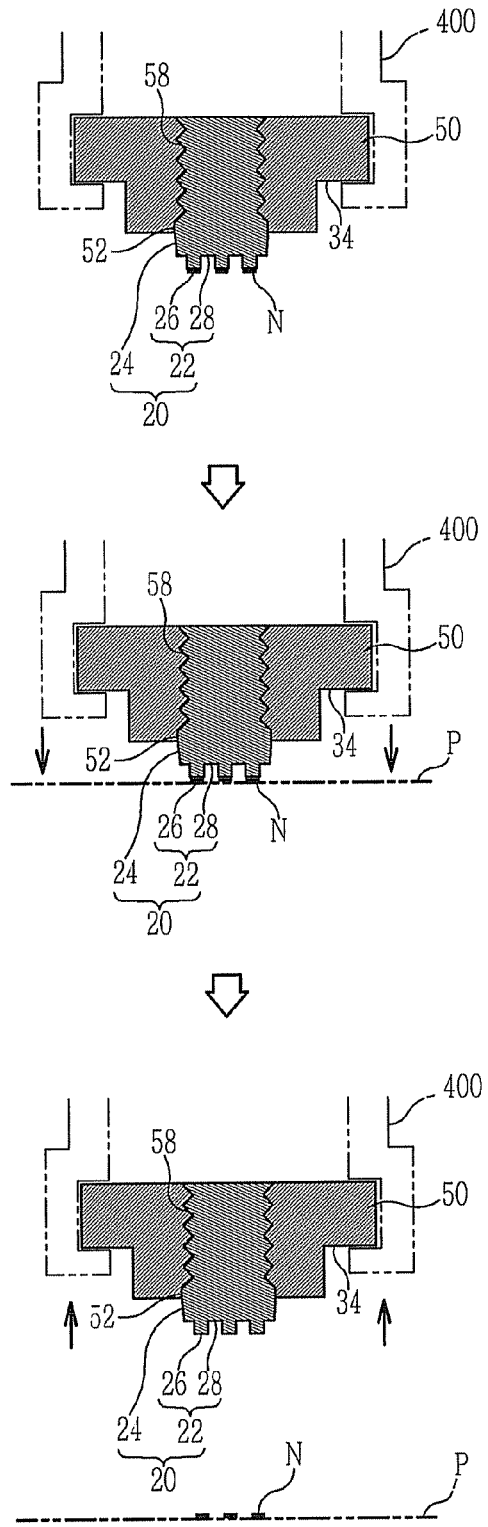
FIG. 2 is a sectional view illustrating a procedure for forming a micropattern on a substrate or a glass through the patterning mold according to example embodiments.

FIG. 1 is a sectional view illustrating a patterning mold according to example embodiments. FIG. 2 is a sectional view illustrating a procedure for forming a micropattern on a substrate or a glass through the patterning mold according to example embodiments.

As shown in FIGS. 1 and 2, a patterning mold 10 according to example embodiments may include a transfer body 20 and a fixing member 50.

The transfer body 20 may be configured to come into contact with a substrate or glass P in a process of forming a micropattern on the substrate or glass P. The transfer body 20 may include a patterning part 22 and a fixing part 24 as shown in FIG. 1.

The patterning part 22 may be provided at one end of the transfer body 20, to transfer a nanoparticle material N while coming into contact with the substrate or glass P. The patterning part 22 may include convex portions 26 configured to come into contact with the substrate or glass P, and concave portions 28 each arranged between adjacent ones of the convex portions 26.

The convex portions 26 may come into contact with the substrate or glass P under the condition that they are coupled with the nanoparticle material N, which may be ink or the like, and transfer the nanoparticle material N to the substrate or glass P.

The concave portions 28, which may be arranged between the adjacent convex portions 26, may form an embossed pattern corresponding to a micropattern to be formed on the substrate or glass P.

Figure 3:
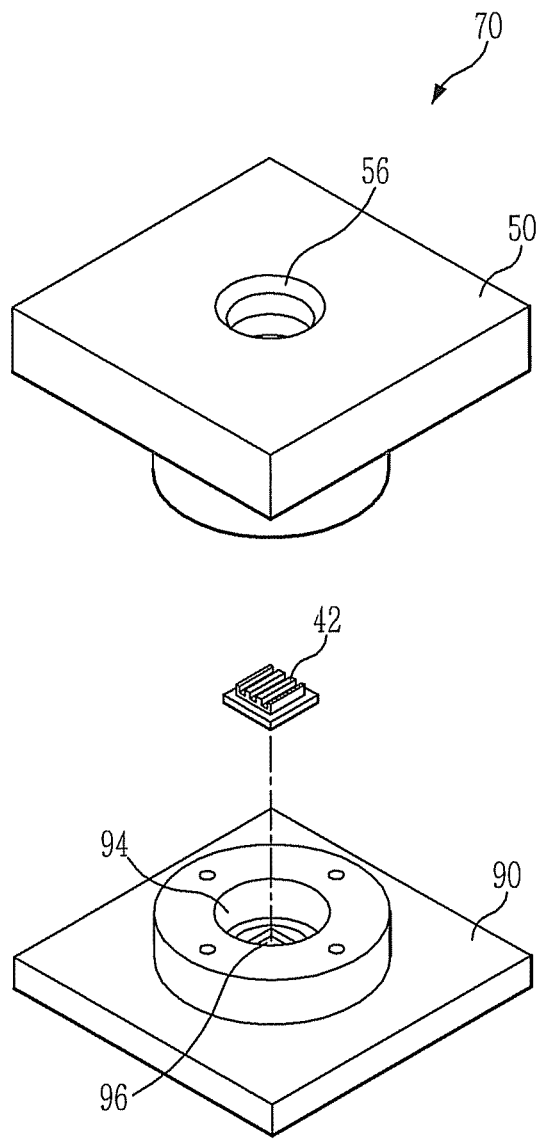
FIG. 3 is a perspective view illustrating a patterning mold molding apparatus for manufacture of a patterning mold according to example embodiments.

The patterning part 22, which may include the convex and concave portions 26 and 28, may be formed at the transfer body 20 by a master pattern 42 (FIG. 3) provided at a second mold 90 (FIG. 3). This will be described in detail later.

The fixing part 24 may be configured to be integrated with the patterning part 22. The fixing part 24 may be connected with an upper portion of the patterning part 22.

The fixing part 24 may be coupled to a transfer body fixing portion 52, to fix the transfer body 20 to the fixing member 50.

The fixing member 50 may be coupled to an exterior of the transfer body 20, to prevent or reduce the exterior of the transfer body 20 from being deformed. The fixing member 50 may include an injection port 56 and a step 34, in addition to the transfer body fixing portion 52.

The transfer body fixing portion 52 may have a shape corresponding to the transfer body 20, in order to allow the transfer body 20 to be formed inside the transfer body fixing portion 52 while having a shape defined by the transfer body fixing portion 52, and to be coupled with the transfer body fixing portion 52. The transfer body fixing portion 52 may include irregularities 58 to prevent the transfer body 20 from being separated from the fixing member 50.

The irregularities 58, which may be provided at the transfer body fixing portion 52, enhance the coupling force between the transfer body 20 and the transfer body fixing portion 52, thereby indirectly reinforcing the transfer body 20.

As shown in FIG. 2, the irregularities 58 may be formed to have a thread shape. When the irregularities 58 are formed to have a thread shape, this formation may be achieved using a standard thread machining tool, as opposed to a special purpose-built machining tool.

The injection port 56 (FIG. 3) may be provided at an upper portion of the fixing member 50, to extend through the fixing member 50. The injection port 56 functions as a passage to inject a material of the transfer body 20 into a cavity 122 formed by the fixing member 50 and the second mold 90 (FIG. 3) in a procedure of manufacturing the patterning mold 10.

The injection port 56 also functions to prevent air bubbles from being formed in a procedure of curing the material of the transfer body 20. That is, the injection port 56 allows air bubbles, which are formed in the procedure of curing the material of the transfer body 20, to move upwardly, and exit outwardly, thereby preventing air bubbles from being left in the transfer body 20.

The step 34 of the fixing member 50 may be coupled to patterning equipment 400.

The patterning equipment 400 may be arranged over the substrate or glass P. The patterning mold 10, which includes the fixing member 50, may be coupled to one end of the patterning equipment 400. The patterning equipment 400 may operate to form a micropattern having a desired shape on the substrate or glass P while feeding/moving the patterning mold 10 in a horizontal or vertical direction.

The step 34, which is provided at the fixing member 50, may be firmly fixed to one end of the patterning equipment 400. The shape of the step 34 may be changed in accordance with the structure or shape of the end of the patterning equipment 400.

In example embodiments, the material of the fixing member 50 may be aluminum alloy or stainless steel alloy, however, example embodiments are not limited thereto.

As shown in FIG. 2, the patterning mold 10 may be fed in a horizontal or vertical direction in a state of being coupled to one end of the patterning equipment 400 under a condition that a nanoparticle material N is coupled to the patterning parts 22. When the patterning mold 10 comes into contact with the substrate or glass P, the nanoparticle material N is transferred to the substrate or glass P, so that a micropattern having a desired shape is formed on the substrate or glass P.

Since the transfer body 20 is coupled to the fixing member 50, it may be possible to minimize deformation of the transfer body 20 during the procedure in which the transfer body 20 is fed by the patterning equipment 400 or comes into contact with the substrate or glass P. Accordingly, it may be possible to precisely form a desired micropattern.

Hereinafter, an apparatus for manufacturing the above-described patterning mold 10 and a molding process for the patterning mold 10 will be described in detail.

FIG. 3 is a perspective view illustrating a patterning mold molding apparatus for manufacture of the patterning mold according to example embodiments. FIGS. 4A to 4D are sectional views illustrating processing steps for manufacturing the patterning mold according to the illustrated embodiment. FIG. 5 is a view illustrating a process for manufacturing a master pattern to be used in the manufacture of the patterning mold according to the illustrated embodiment.

Referring to FIG. 3, a patterning mold molding apparatus 70 for manufacturing the patterning mold 10 is shown. In example embodiments, the patterning mold molding apparatus 70 may include a first mold 50 and a second mold 90.

The first mold 50 may be coupled to the transfer body 20, to form the patterning mold 10. The structure and function of the first mold 50 are identical to those of the fixing member 50. Accordingly, no description will be given of the first mold 50.

The second mold 90 may be coupled with the first mold 50, to form a cavity 122 (FIG. 4), into which the material of the transfer body 20 may be injected. The second mold 90 may include a master pattern 42 and an inclined portion 94.

The master pattern 42 may be arranged in a groove 96 formed in the second mold 90. The master pattern 42 forms the patterning part 22 at the transfer body 20.

As described above, the patterning part 22 may include the convex portions 26 configured to come into contact with the substrate or glass P, and the concave portions 28 each arranged between adjacent convex portions 26. Accordingly, the master pattern 42 to form the patterning part 22 may have a shape corresponding to the patterning part 22 including the convex and concave portions 26 and 28. That is, the master pattern 42 forms a depressed pattern corresponding to the embossed pattern, which is formed by the convex and concave portions 26 and 28 of the patterning part 22, to have a shape corresponding to the micropattern to be formed on the substrate or glass P.

A patterning process using photoresist may be used to manufacture the master pattern 42. As shown in FIG. 5, a photoresist film 104 may be coated over a surface of a silicon (Si) wafer 102. A photomask 106 having a desired pattern may then be arranged on the photoresist film 104. The resultant structure may then be exposed to ultraviolet light. When a developer is applied to the photoresist film 104, once the exposure process is completed, the photoresist film 104, except for an unexposed portion thereof shielded by the photomask 106, may be removed to a certain depth. Finally, the photoresist film 104 subjected to the above process may be etched in accordance with a reactive ion etching (RIE) process. Thus, the master pattern 42, which has a desired pattern shape, is obtained.

As described above, the master pattern 42 may be separately manufactured through the patterning process, which uses photoresist, and may then be arranged in the groove 96 formed at the second mold 90. However, the master pattern 42 may also be directly formed at the groove 96 without being separately manufactured. That is, the master pattern 42 may be directly formed at the groove 96 by machining a desired pattern in the groove 96 by use of a machining tool.

The inclined portion 94, which extends at an incline, may be arranged above the groove 96. The inclined portion 94 may allow the transfer body 20 to be easily separated from the second mold 90 in a state of being coupled with the first mold 50.

It may be possible to more easily separate the transfer body 20 from the second mold 90 by performing a releasing treatment, for example, coating a releasing agent over the inclined portion 94.

Hereinafter, the process of manufacturing the patterning mold 10 according to example embodiments, using the first mold 50 and second mold 90, will be described.

Figure 4A:
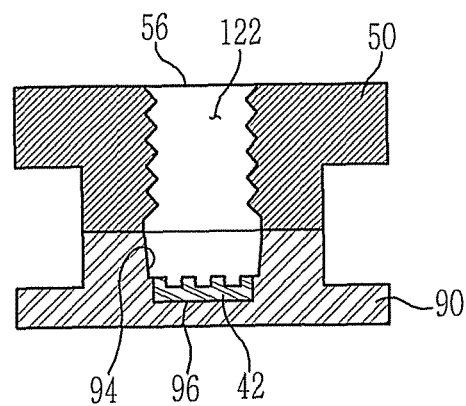
FIGS. 4A to 4D are sectional views illustrating processing steps for manufacturing a patterning mold according to example embodiments.

As shown in FIG. 4A, the master pattern 42 may be arranged at the groove 96 of the second mold 90. In example embodiments, the first mold 50 and second mold 90 may be coupled such that the cavity 122, into which the material of the transfer body 20 is injected, is formed.

In this state, the transfer body fixing portion 52 formed at the first mold 50 is coupled with the inclined portion 94 formed at the second mold 90, thereby forming the cavity 122, into which the material of the transfer body 20 may be injected, as a space having a shape corresponding to the exterior of the transfer body 20.

Figure 4B:
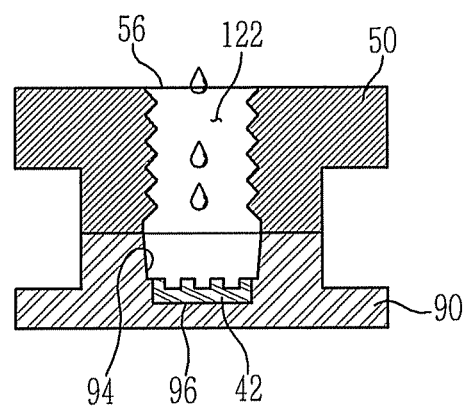

Under the condition that the first mold 50 and second mold 90 are coupled, the material of the transfer body 20 is injected through the injection port 56 provided at the first mold 50, as shown in FIG. 4B.

As the material for the transfer body 20, any material may be used, so long as the material is present in a liquid phase having flowability before heat or photo treatment, but is cured after heat or photo treatment, thereby being stabilized in a solid phase. For a material having such properties, a thermosetting resin or a photocurable resin may be used.

Figure 4C:
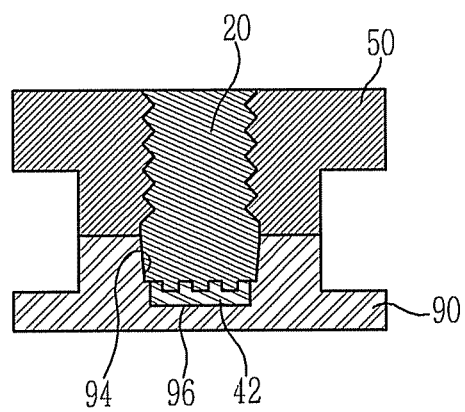

Upon completion of the process of injecting the material of the transfer body 20, a process of curing the material of the transfer body 20 injected into the cavity 122 formed by the first mold 50 and second mold 90 is carried out, as shown in FIG. 4C. Where the material of the transfer body 20 is a thermosetting resin or a photocurable resin, a heat treatment process or a photo treatment process may be additionally carried out.

The material of the transfer body 20 may be firmly fixed to the first mold 50 during curing.

Figure 4D:
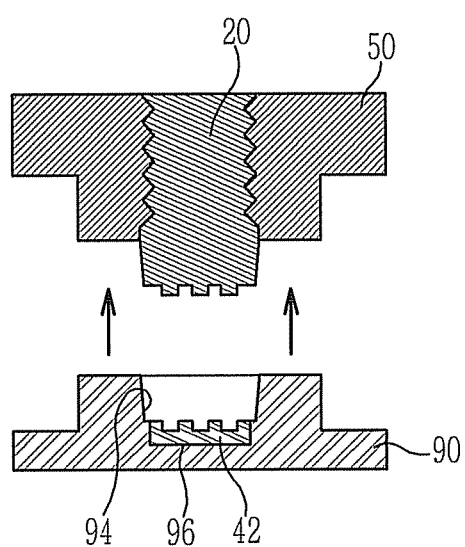

After the material of the transfer body 20 is completely cured, the first mold 50 and the transfer body 20 coupled and fixed to the first mold 50 are separated from the second mold 90, as shown in FIG. 4D.

As the first mold 50 and the transfer body 20 coupled and fixed to the first mold 50 are separated from the second mold 90, they form the patterning mold 10 to form a micropattern on the substrate or glass P.

In example embodiments, since the second mold 90 may be formed with the inclined portion 94, and the inclined portion 94 may be subjected to a releasing treatment, the patterning mold 10 may be easily separated from the second mold 90.

Since the patterning mold 10 is manufactured by coupling the transfer body 20, which has low mechanical strength, to the first mold 50, it may be possible to reduce deformation of the patterning mold 10 in the procedure of forming a micropattern on the substrate or glass P, using the patterning mold 10. Accordingly, it may be possible to precisely form a desired micropattern.

Figure 6:
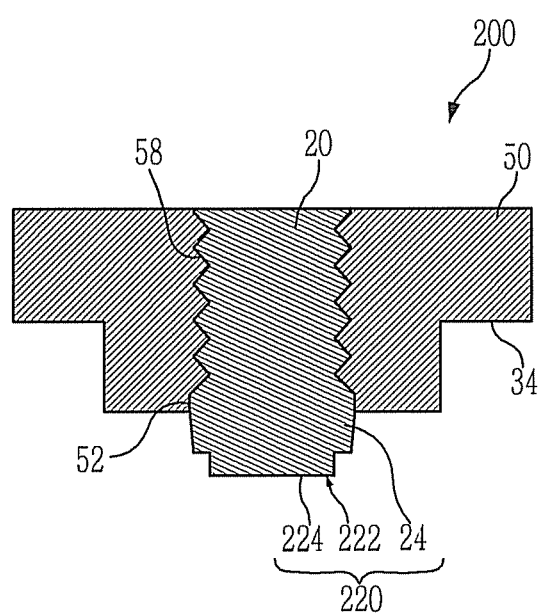
FIG. 6 is a sectional view illustrating a patterning mold according to example embodiments.
Figure 7:
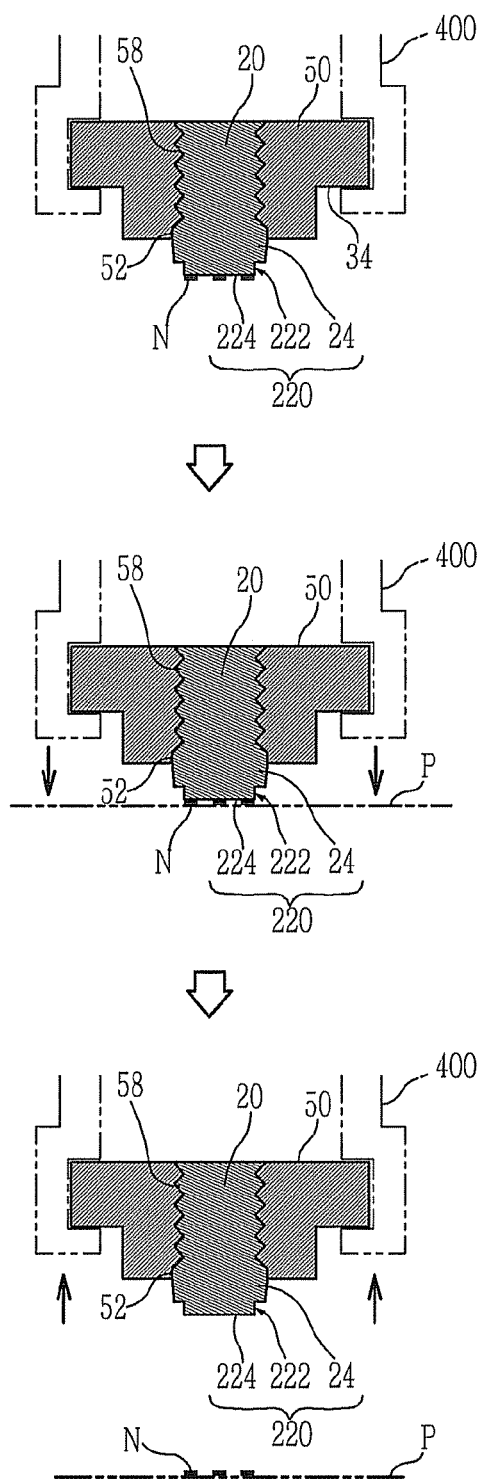
FIG. 7 is a sectional view illustrating a procedure for forming a micropattern on a substrate or a glass using a patterning mold according to example embodiments.
Figure 8:
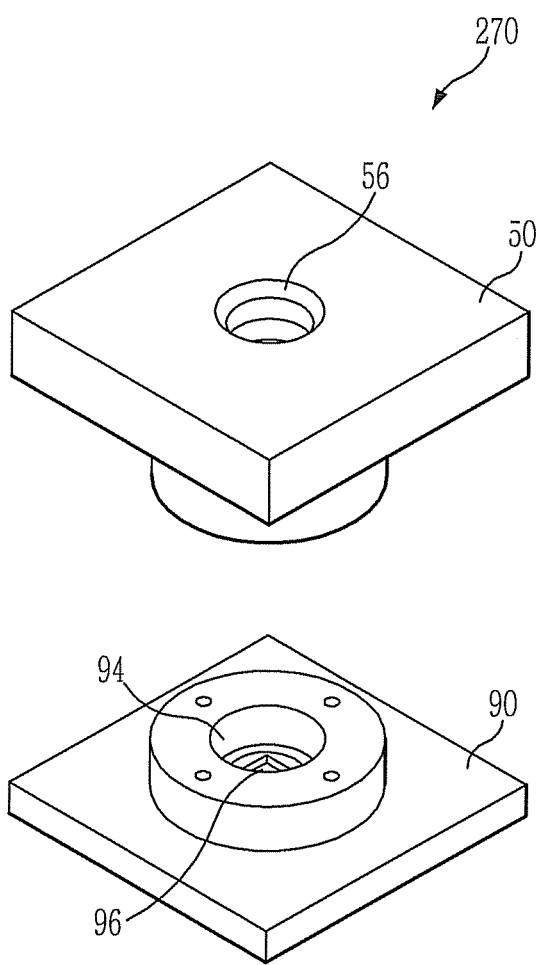
FIG. 8 is a perspective view illustrating a patterning mold molding apparatus for manufacture of a patterning mold according to example embodiments.
Figure 9A:
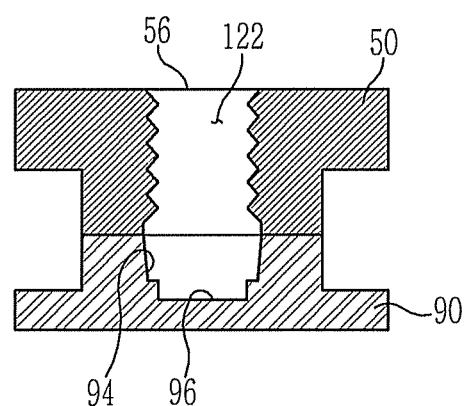
FIGS. 9A to 9D are sectional views illustrating processing steps for manufacturing a patterning mold according to example embodiments.
Figure 9B:
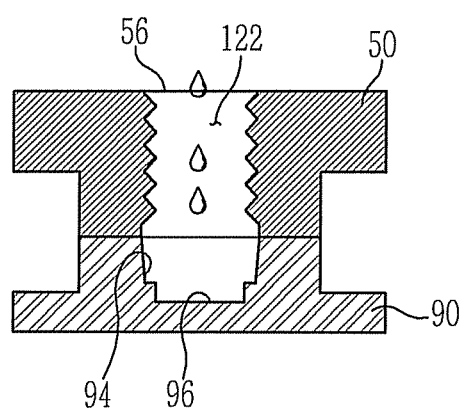
Figure 9C:
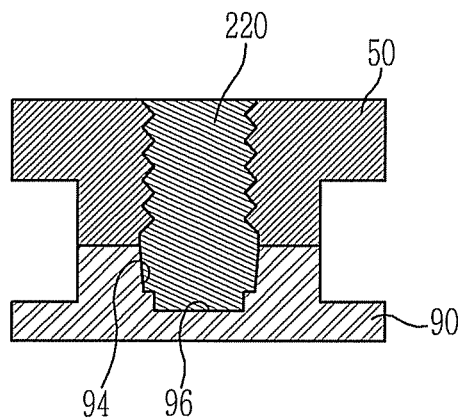
Figure 9D:
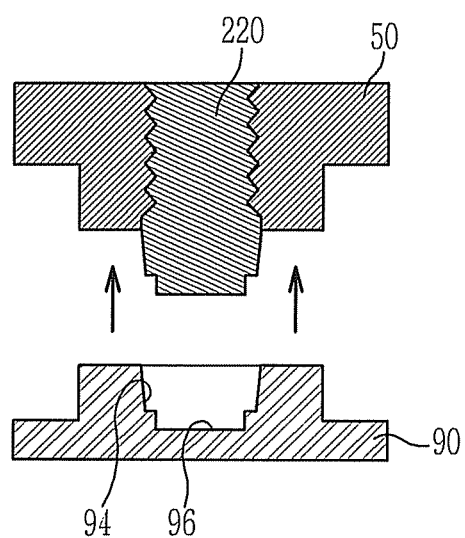

FIG. 6 is a sectional view illustrating a patterning mold according to example embodiments. FIG. 7 is a sectional view illustrating a procedure for forming a micropattern on a substrate or a glass through the patterning mold according to example embodiments.

As shown in FIGS. 6 and 7, a patterning mold 200 may be identical to the previously described patterning mold 10, except for a patterning part 222 provided at a transfer body 220. Accordingly, the following description will be given mainly in conjunction with the patterning part 222.

The patterning part 222 may be provided at one end of the transfer body 220, to transfer a nanoparticle material N while coming into contact with a substrate or glass P. The patterning part 222 may include a transfer surface 224 to be coupled with the nanoparticle material N.

The transfer surface 224 may be a planar surface having a flatness that may or may not be predetermined. The transfer surface 224 may couple, to a planar surface thereof, the nanoparticle material N, which may be patterned in the form of a micropattern on the substrate or glass P, and then transfer the nanoparticle material N to the substrate or glass P while maintaining the patterned shape of the nanoparticle material N.

The transfer surface 224 may be made of a resin exhibiting a bonding force in a cured state, such as poly dimethyl siloxane (PDMS), so that it may be coupled with the nanoparticle material N. In example embodiments, the bonding force may or may not be predetermined. Since ink or the like, as the nanoparticle material N, has a certain viscosity and surface tension, the nanoparticle material N does not move on the transfer surface 224 or is not separated from the transfer surface 224 when it is fed in a state of being coupled to the transfer surface 224.

As shown in FIG. 7, the patterning mold 200 may be coupled to one end of the patterning equipment 400 under the condition that the nanoparticle material N, which is patterned in the form of a micropattern, is coupled to the planar surface of the transfer surface 224. The patterning mold 200 may be fed in a horizontal or vertical direction by the patterning equipment 400, to come into contact with the substrate or glass P, and thus to transfer the nanoparticle material N to the substrate or glass P. Thus, a micropattern may be formed on the substrate or glass P.

It may be possible to minimize deformation of the transfer body 200 in the procedure in which the transfer body 200 is fed by the patterning equipment 400 or comes into contact with the substrate or glass P because the transfer body 220 is coupled to the fixing member 50. Thus, it may be possible to precisely form a desired micropattern.

As shown in FIG. 8 and FIGS. 9A to 9D, the master pattern 42, which is used in the manufacture of the patterning mold 10 according to example embodiments, may not used in a molding apparatus 270 for the patterning mold 200 according to example embodiments and in the manufacture of the patterning mold 200. This is because it is unnecessary to form a separate pattern having a shape corresponding to the micropattern on the transfer surface 224 in that the transfer surface 224 is constituted by a planar surface having a flatness, in order to allow the nanoparticle material N patterned in the form of the micropattern to be coupled to the planar surface, and thus to be transferred to the substrate or glass P while maintaining the patterned shape thereof. In example embodiments, the flatness may or may not be predetermined.

In example embodiments, the molding apparatus 270 for manufacturing the patterning mold 200 and the procedure for molding the patterning mold 200 are identical to those associated with the patterning mold 10, except that the master pattern 42 is not used. Accordingly, no concrete description will be given of the molding apparatus 270 and the molding procedure for the patterning mold 200.

Figure 10:
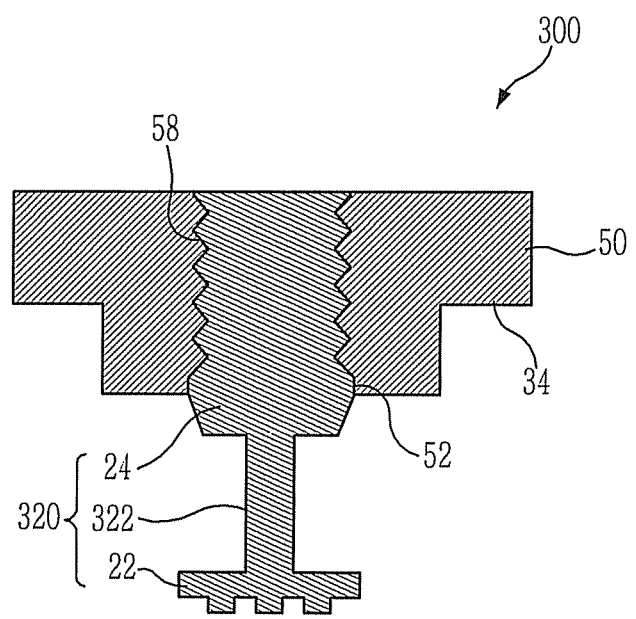
FIG. 10 is a sectional view illustrating a patterning mold according to example embodiments.
Figure 11:
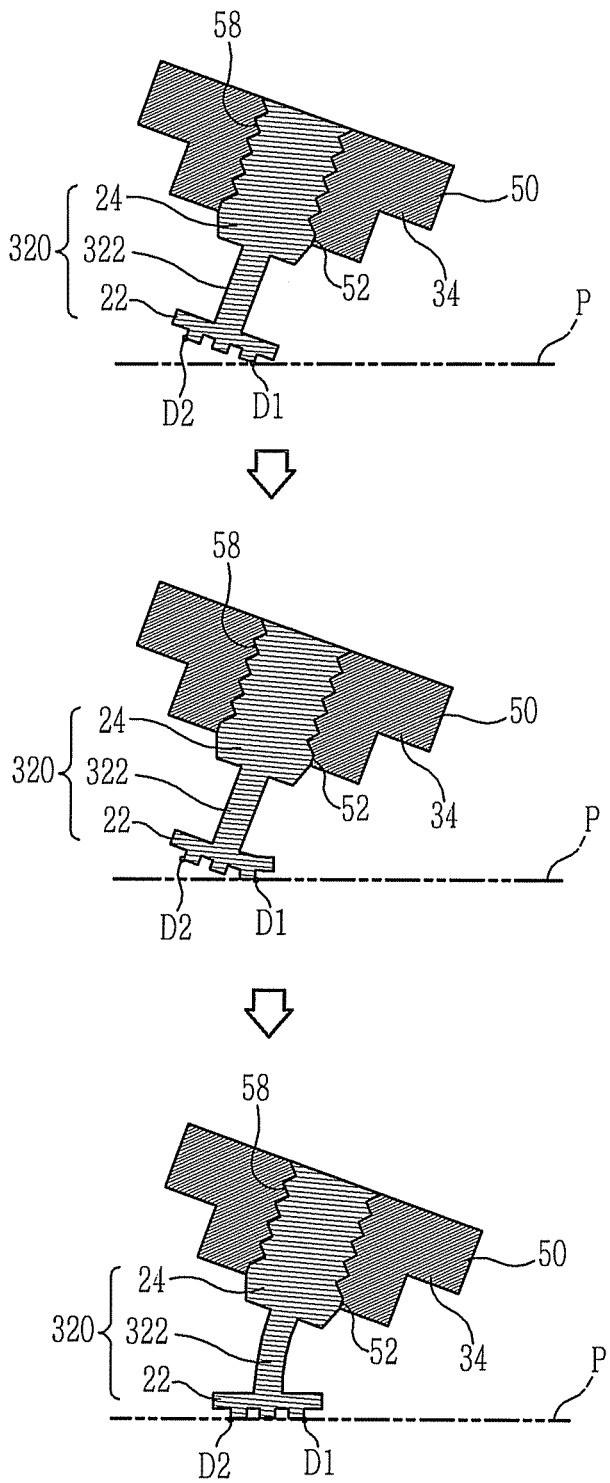
FIG. 11 is a sectional view illustrating a procedure for forming a micropattern on a substrate or a glass using a patterning mold according to example embodiments.
Figure 12:
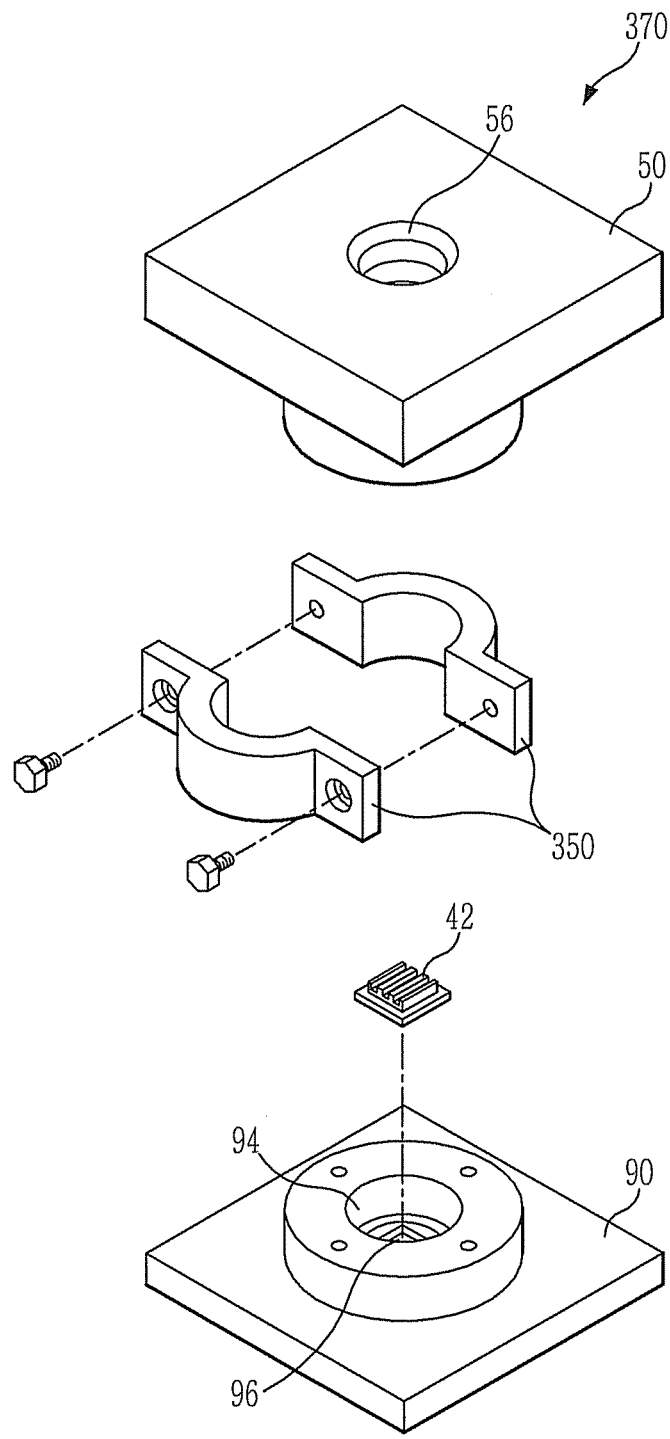
FIG. 12 is a perspective view illustrating a patterning mold molding apparatus for manufacturing a patterning mold according to example embodiments.

FIG. 10 is a sectional view illustrating a patterning mold according to example embodiments. FIG. 11 is a sectional view illustrating a procedure for forming a micropattern on a substrate or a glass using the example patterning mold illustrated in FIG. 10. FIG. 12 is a perspective view illustrating a patterning mold molding apparatus for manufacturing the patterning mold according to example embodiments as illustrated in FIG. 10.

As shown in FIGS. 10 to 12, a patterning mold 300 according to example embodiments may be identical to the example patterning mold 10 or 200 according to example embodiments, except for a hinge part 322 provided at a transfer body 320. Accordingly, the following description will be given mainly in conjunction with the hinge part 322.

Also, although the case, in which the hinge part 322 is applied to the patterning mold 10, is illustrated in FIGS. 10 to 12, it will be appreciated that the hinge part 322 may also be applied to the patterning mold 200.

The hinge part 322 may be configured to prevent the patterning part 22 from being excessively deformed in the procedure of coming into contact with the substrate or glass P. As shown in FIG. 10, the hinge part 322 may be arranged between the fixing part 24 and the patterning part 22.

The patterning mold 300 may be coupled to one end of the patterning equipment 400 under the condition that the nanoparticle material N is coupled to the patterning part 22. In this state, the patterning mold 300 may be fed in a horizontal or vertical direction by the patterning equipment 400, to come into contact with the substrate or glass P, and thus to transfer the nanoparticle material N to the substrate or glass P. Thus, a micropattern having a desired shape may be formed on the substrate or glass P. In the contact procedure, however, the patterning part 22 may come into contact with the substrate or glass P without being maintained in a horizontal state.

Because the micropattern has a micrometer or nanometer scale, and is precisely arranged on the substrate or glass P, it may be impossible to form a micropattern having a desired shape at a desire position, if the relative levelness between the patterning part 22 and the substrate or glass P exceeds a predetermined range. In this case, poor products may be formed.

The hinge part 322 provided between the fixing part 24 and patterning part 22 of the transfer body 320 exhibits relatively low bending stiffness because it has a smaller cross-sectional area than the patterning part 22. For this reason, when external force is applied to the transfer body 320, the hinge part 322 is more easily deformed, as compared to the patterning part 22. That is, when the patterning part 22 comes into contact with the substrate or glass P, vertical force is applied to the patterning part 22. However, this force is transferred to the hinge part 322 connected to the patterning part 22. As a result, the hinge part 322, which has a low bending stiffness, as compared to the patterning part 22, is deformed before the patterning part 22 is deformed. Thus, it may be possible to prevent or reduce deformation of the patterning part 22 when the patterning part 22 is contacted against a substrate or glass P.

As shown in FIG. 11, even if the relative levelness between the patterning part 22 and the substrate or glass P exceeds the predetermined range during the procedure in which the patterning part 22 comes into contact with the substrate or glass P, the patterning part 22 sequentially comes into contact with the substrate or glass P from a portion D1 thereof near the substrate or glass P to a portion D2 thereof far from the substrate or glass P with little to no deformation, because the patterning part 22 absorbs the force applied to the patterning part 22 coming into contact with the substrate or glass P, through deformation.

Since the relative levelness between the patterning part 22 and the substrate or glass P is kept within a range by the patterning mold 300, it may be possible to precisely form a desired micropattern. In example embodiments, the range may or may not be predetermined.

As shown in FIG. 12, the patterning mold molding apparatus 370 for the manufacture of the patterning mold 300 according to example embodiments further includes a third mold 350.

The third mold 350 may be arranged between the first mold 50 and the second mold 90, to form the hinge part 322 between the fixing part 24 and the patterning part 22.

In example embodiments, the constituent elements of the patterning mold molding apparatus 370, except for the third mold 350, namely, the first mold 50 and second mold 90 of the patterning mold molding apparatus 370, are identical to those of the patterning mold molding apparatus 70 for the manufacture of the patterning mold 10 according to example embodiments. Accordingly, no further description will be given of the patterning mold molding apparatus 370.

Figure 13A:
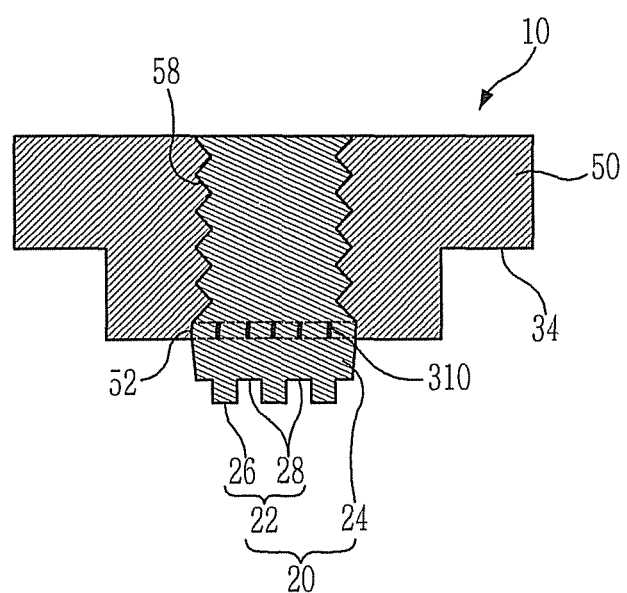
FIGS. 13A to 13C are sectional views each illustrating a coupled state of a reinforcing member to the patterning mold according to example embodiments.
Figure 13B:
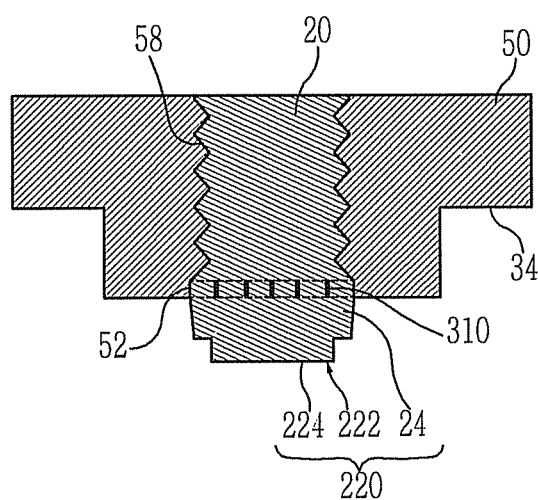
Figure 13C:
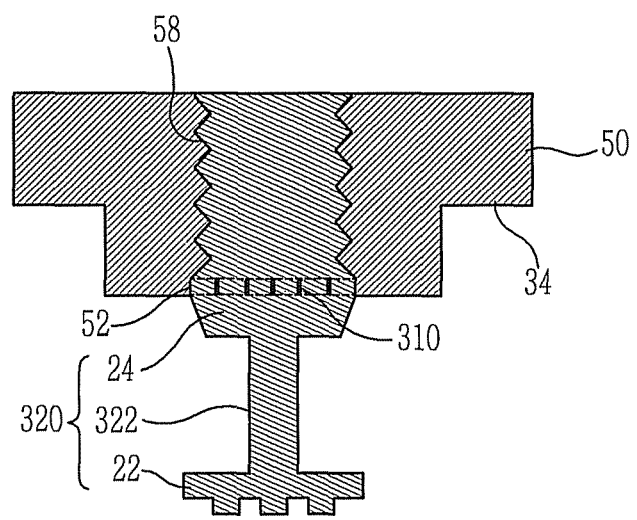

As shown in FIGS. 13A and 13B, a reinforcing member 310 may be coupled to the patterning mold 10, 200, or 300 according to example embodiments.

Where the patterning mold 10, 200, or 300 has a relatively large size such that the area of the transfer body 20, 220, or 320 increases over a certain area, there may be a phenomenon in which the transfer body 20, 220, or 320 is deformed due to gravity.

The reinforcing member 310 may be provided at an inner peripheral surface of the first mold 50. The reinforcing member 310 may be fixed to the transfer body 20, 220, or 320 when the material of the transfer body 20, 220, or 320 is cured, thereby reinforcing the transfer body 20, 220, or 320, and the first mold 50. Thus, even when the patterning mold 10, 200, or 300 has a relatively large size, it may be possible to perform a micropattern forming process while maintaining high precision, without a deformation phenomenon occurring at the transfer body 20, 220, or 320 due to gravity, in accordance with use of the reinforcing member 310.

As apparent from the above description, a deformation of a patterning mold may be reduced or minimized in the procedure in which a micropattern is formed on the substrate or glass, in accordance with example embodiments. Accordingly, an improvement in product quality may be achieved.

Also, since the deformation of the patterning mold is reduced or minimized in the procedure in which a micropattern is formed on the substrate or glass, it may be possible to prevent or reduce formation of poor products caused by deformation of the patterning mold.

Although example embodiments have been shown and described, it would be appreciated by those skilled in the art that changes may be made in example embodiments without departing from the principles and spirit of the invention, the scope of which is defined in the claims and their equivalents.

What is claimed is:

1. A patterning mold, comprising:
   a transfer body, the transfer body including a patterning part at one end of the transfer body, a fixing part at the other end of the transfer body, and a hinge part between the patterning part and the fixing part, the patterning part having recesses and projections and configured to transfer a nanoparticle material to a surface of a substrate, the transfer body being a monolithic body and formed of a flowable and curable material; and
   a fixing member coupled to an exterior of the transfer body, the fixing member being configured to reduce a deformation of the exterior of the transfer body,
   wherein the patterning part is wider than the hinge part and the hinge part has a rod shape and connects the fixing part and the patterning part together.

2. The patterning mold according to claim 1, wherein the patterning part includes convex portions configured to couple with the nanoparticle material, and concave portions arranged between adjacent convex portions.

3. The patterning mold according to claim 1, wherein the fixing member includes a transfer body fixing portion, and the fixing part is coupled with the transfer body fixing portion.

4. The patterning mold according to claim 3, wherein the hinge part is between the fixing part and the patterning part and is configured to reduce deformation of the patterning part when the patterning part comes into contact with the surface of the substrate.

5. The patterning mold according to claim 4, wherein the hinge part has a smaller cross-sectional area than the patterning part.

6. The patterning mold according to claim 1, wherein the fixing member includes a step and the step is configured to couple with patterning equipment to move the patterning mold.

7. The patterning mold according to claim 3, wherein the transfer body fixing portion is provided with irregularities to enhance a coupling force between the transfer body and the fixing member.

8. The patterning mold according to claim 7, wherein the irregularities have a thread shape.

9. The patterning mold according to claim 3, wherein the transfer body fixing portion includes a reinforcing member and the reinforcing member is coupled with the transfer body to reduce deformation of the transfer body due to gravity.

10. The patterning mold according to claim 1, wherein the transfer body is configured to couple the transfer body with the fixing member during curing.

* * * * *